US006989315B2

(12) United States Patent
Dolan et al.

(10) Patent No.: US 6,989,315 B2
(45) Date of Patent: Jan. 24, 2006

(54) SIMOX USING CONTROLLED WATER VAPOR FOR OXYGEN IMPLANTS

(75) Inventors: Robert Dolan, Hudson, NH (US); Bernhard Cordts, Ipswich, MA (US); Marvin Farley, Ipswich, MA (US); Geoffrey Ryding, Manchester, MA (US)

(73) Assignee: Ibis Technology, Inc., Danvers, MA (US)

( * ) Notice: Subject to any disclaimer, the term of this patent is extended or adjusted under 35 U.S.C. 154(b) by 0 days.

(21) Appl. No.: 09/884,451

(22) Filed: Jun. 19, 2001

(65) Prior Publication Data

US 2002/0016046 A1 Feb. 7, 2002

Related U.S. Application Data

(63) Continuation of application No. 09/339,633, filed on Jun. 24, 1999, now Pat. No. 6,248,642.

(51) Int. Cl.
*H01L 21/76* (2006.01)

(52) U.S. Cl. ........................ 438/423; 438/404; 438/407

(58) Field of Classification Search ................. 438/404, 438/407, 423, 480, 771, 788, 416, 766, 724, 438/475, 455, 530
See application file for complete search history.

(56) References Cited

U.S. PATENT DOCUMENTS 3,954,191 A 5/1976 Wittkower et al.
4,539,217 A 9/1985 Farley
4,586,743 A 5/1986 Edwards et al.
4,952,299 A 8/1990 Chrisos et al.
4,962,049 A 10/1990 Chang et al.
5,053,627 A 10/1991 Ruffel et al.

(Continued)

FOREIGN PATENT DOCUMENTS

FR 2 770 684 A1 11/1998
GB 2 325 561 A 11/1998
JP 4336421 11/1992

OTHER PUBLICATIONS

G. Hinrichs et al., "A New Process For Simultaneous Fabrication of a Buried and a Surface Oxide Layer" (Solid State Electronics), vol. 39, No. 2, pp. 231–235 (1996).

Datta et al., "Effect of Varying Implant Energy and Dose on the SIMOX Microstructure", Proceedings 1997 IEEE International SOI Conference, Oct. 1997, pp. 42–43.

*Primary Examiner*—George Fourson
*Assistant Examiner*—Julio Maldonado
(74) *Attorney, Agent, or Firm*—Thomas J. Engellenner; Reza Mollaaghababa; Nutter McClennen & Fish LLP

(57) ABSTRACT

An ion implantation system for producing silicon wafers having relatively low defect densities, e.g., below about $1\times10^6/cm^2$, includes a fluid port in the ion implantation chamber for introducing a background gas into the chamber during the ion implantation process. The introduced gas, such as water vapor, reduces the defect density of the top silicon layer that is separated from the buried silicon dioxide layer.

15 Claims, 4 Drawing Sheets

U.S. PATENT DOCUMENTS

| | | | | |
|---|---|---|---|---|
| 5,080,730 A | | 1/1992 | Wittkower | |
| 5,096,364 A | | 3/1992 | Messer et al. | |
| 5,196,355 A | | 3/1993 | Wittkower | |
| 5,240,046 A | | 8/1993 | Mack | |
| 5,266,502 A | | 11/1993 | Okada et al. | |
| 5,288,650 A | | 2/1994 | Sandow | |
| 5,308,989 A | | 5/1994 | Brubaker | |
| 5,310,689 A | | 5/1994 | Tomozane et al. | |
| 5,426,558 A | | 6/1995 | Sherman | |
| 5,436,790 A | | 7/1995 | Blake et al. | |
| 5,441,899 A | | 8/1995 | Nakai et al. | |
| 5,452,177 A | | 9/1995 | Frutiger | |
| 5,466,945 A | | 11/1995 | Brickell | |
| 5,468,657 A | * | 11/1995 | Hsu | 438/766 |
| 5,483,077 A | | 1/1996 | Glavish | |
| 5,483,138 A | | 1/1996 | Shmookler et al. | |
| 5,508,227 A | | 4/1996 | Chan et al. | |
| 5,611,865 A | | 3/1997 | White et al. | |
| 5,658,710 A | | 8/1997 | Neukermans | |
| 5,661,043 A | | 8/1997 | Rissman et al. | |
| 5,661,044 A | | 8/1997 | Holland et al. | |
| 5,753,923 A | | 5/1998 | Mera et al. | |
| 5,786,231 A | | 7/1998 | Warren et al. | |
| 5,848,889 A | | 12/1998 | Tietz et al. | |
| 5,854,123 A | | 12/1998 | Sato et al. | |
| 5,883,016 A | | 3/1999 | Chan et al. | |
| 5,886,864 A | | 3/1999 | Dvorsky | |
| 5,891,265 A | | 4/1999 | Nakai et al. | |
| 6,248,642 B1 | * | 6/2001 | Dolan et al. | 438/407 |
| 6,313,014 B1 | * | 11/2001 | Sakaguchi et al. | 438/475 |
| 6,506,662 B2 | * | 1/2003 | Ogura et al. | 438/423 |

* cited by examiner

SIMOX USING CONTROLLED WATER VAPOR FOR OXYGEN IMPLANTS

RELATED APPLICATION

This application is a continuation of U.S. patent application Ser. No. 09/339,633 filed on Jun. 24, 1999 now U.S. Pat. No. 6,248,642 and incorporates this application by reference.

BACKGROUND OF THE INVENTION

The present invention relates generally to silicon wafer processing, and more particularly, to Separation by Implanted OXygen" (SIMOX) silicon wafer processing.

Ion implantation techniques are particularly useful in forming a class of buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance and increased radiation hardness). The lesser volume of electrically active semiconductor material in SOI devices, as compared with bulk silicon devices, tends to reduce parasitic effects such as leakage capacitance, resistance, and radiation sensitivity. In addition, the isolation between adjacent devices eliminates parasitic problems such as latch-up.

In one known technique, known by the acronym SIMOX, a thin layer of a monocrystalline silicon substrate is separated from the bulk of the substrate by implanting oxygen ions into the substrate to form a buried dielectric layer. The SIMOX process provides a heterostructure in which a buried silicon dioxide layer serves as a highly effective insulator for surface layer electronic devices.

In the SIMOX process, oxygen ions are implanted into silicon, after which the material is annealed to form the buried silicon dioxide layer or BOX region. The annealing phase redistributes the oxygen ions such that the silicon/silicon dioxide boundaries become smoother and more abrupt, thus forming a sharp and well-defined BOX region.

One important criterion for SIMOX wafers is the defect density, which should be minimized in order to produce high quality wafers. Defect density can be defined in terms of the departure from perfect crystallinity in the silicon layer that is separated from the bulk substrate by the buried oxide layer. In general, as the oxygen ions are implanted into the wafer to produce the buried $SiO_2$ layer, atomic silicon is displaced. Additionally, excess silicon atoms from the growing BOX region can alter the crystal structure of the top silicon layer resulting in a variety of point and extended defects, such as threading dislocations and stacking faults, during the ion implantation and/or annealing processes. These defects degrade the quality and reliability of devices, e.g., transistors, that are subsequently formed in the upper silicon layer.

Hence, there exists a need for better SIMOX wafers having lower defect densities. Processes that can reduce the presence of interstitial silicon would satisfy a long felt need in the art.

SUMMARY OF THE INVENTION

The present invention provides a SIMOX wafer processing system that processes wafers in the presence of a background fluid for reducing the defect densities of the wafers. Although the invention is primarily shown and described as implanting oxygen ions into a bulk silicon wafer, it is understood that the system has other applications as well, such as implanting different types of ions into various materials and the formation of buried oxide (or other compounds) layers in materials in general.

In one aspect of the invention, a SIMOX wafer manufacturing system is disclosed including an ion source for providing an ion beam that is manipulated for optimal implantation of ions into one or more substrates, such as a series of silicon wafers secured on a wafer holder assembly. The system further includes a wafer holder assembly disposed in an implantation or vacuum chamber to which a vacuum pump is coupled for evacuating the chamber to a desired pressure. A fluid port, which is adapted for coupling to a fluid source, provides a passageway for fluid, such as water vapor, to enter the chamber. A fluid valve disposed between the fluid source and the fluid port allows the fluid to enter the chamber.

In a further aspect of the invention, the system further includes a controller for actively controlling the amount of fluid introduced into the chamber based upon one or more operating parameters in the chamber. In one embodiment, a monitoring device is coupled to a sensor located in the chamber for monitoring conditions in the chamber. The controller, which receives information from the sensor, effects desired operating conditions in the chamber by controlling the fluid valve, and thereby the fluid concentration, in the chamber.

In another aspect of the invention, methods for SIMOX wafer processing are disclosed. In one embodiment, silicon wafers are placed within the evacuated implantation chamber and subjected to an ion beam so as to form a buried silicon dioxide layer in the wafers. Before and/or during the implantation process, water vapor is introduced into the vacuum chamber via the fluid port to increase the background pressure in the chamber. Without being bound to a particular scientific explanation, it appears that the water vapor alters the surface chemistry of the wafer during the implantation process permitting displaced silicon atoms to rise to the wafer surface, and thereby, facilitating their removal from the wafer during subsequent processing (e.g., by sputtering or etching of the wafer surface). By decreasing the amount of interstitial silicon trapped in silicon device layer, the defect density of the processed wafers is reduced.

BRIEF DESCRIPTION OF THE DRAWINGS

The invention will be more fully understood from the following detailed description taken in conjunction with the accompanying drawings, in which.

DETAILED DESCRIPTION OF THE INVENTION

Figure 1:
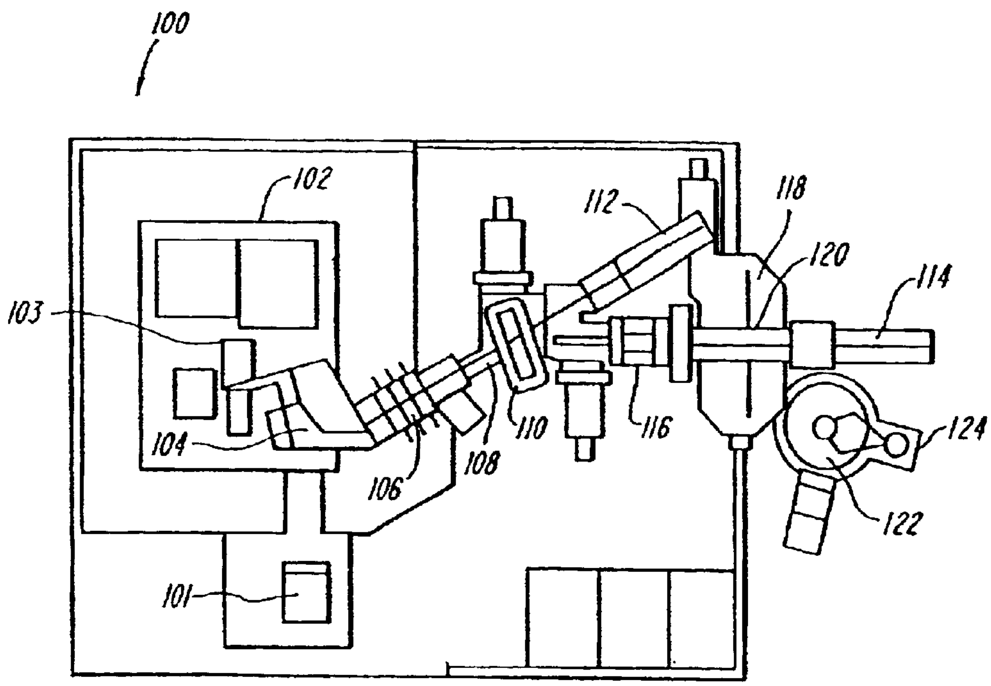
FIG. 1 is a diagrammatic representation of an ion implantation system in accordance with the present invention.

FIG. 1 shows an exemplary ion implantation system 100 in accordance with the present invention. The system 100 includes various components and subsystems to generate and control the ion beam that is applied to silicon wafers. A motor generator 101 supplies power to a high voltage terminal 102 and an ion source 103 provides a source of oxygen ions for implantation into the bulk silicon wafers. In one embodiment, the ion source 103 includes a microwave ECR ion source coupled to a magnetron. A mass analyzer 104 focuses and purifies the generated oxygen ion beam. In an exemplary embodiment, the mass analyzer 104 includes a three segment magnet with poles integrated into a vacuum enclosure through which the ion beam passes. A post accelerator column 106, which is located downstream from the mass analyzer 104, provides additional energy and focuses the ion beam and a magnetic scanner 108 produces a desired beam scan profile. The ion beam reaches a neutral filter 110, such as a bending magnet, that separates neutral beams, which travel to a neutral beam dump 112, from the charged oxygen ion beam, which travels to a beam dump Faraday 114. A collimator 116, which is located between the neutral filter 110 and a vacuum or implantation chamber 118, deflects the beam such that it enters the vacuum chamber 118 parallel to the axis of rotation of a wafer holder 120. In an exemplary embodiment, wafers are loaded into the vacuum chamber by means of an autoloader 122 in combination with a vacuum load/lock assembly 124.

Figure 2:
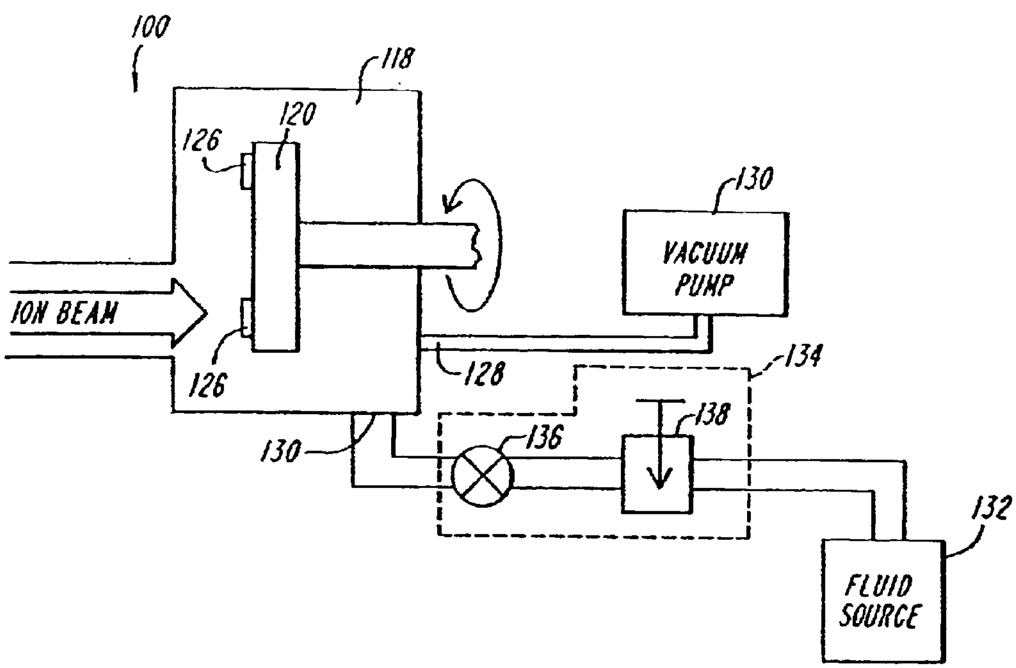
FIG. 2 is a diagrammatic representation of an implantation chamber that forms a part of the system of FIG. 1.
Figure 3:
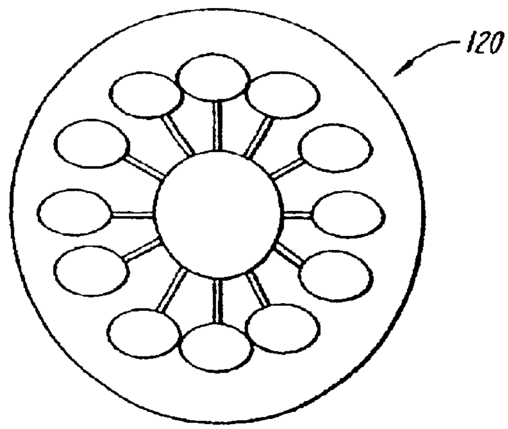
FIG. 3 is a diagrammatic representation of a wafer holder assembly for holding wafers within the chamber of FIG. 2.

FIG. 2 shows further details of the implantation or vacuum chamber 118. Wafers 126 are secured on the rotatable wafer holder, such as the wafer holder 120 shown in FIG. 3. The chamber 118 includes at least one vacuum port 128 coupled to a vacuum pump 130 for evacuating the chamber 118. At least one fluid inlet port 130 is also formed in the chamber 118 and is adapted for coupling to a fluid source 132. A fluid valve 134 is coupled to the fluid inlet port 130 and to the fluid source 132. In an exemplary embodiment, the fluid valve 134 includes an isolation valve 136 and a needle valve 138 for regulating the amount of fluid introduced into the chamber 118 as a background gas. It is understood that many other types of valve mechanisms for regulating fluid flow into the chamber are known to one of ordinary skill in the art.

In operation, the wafers 126 are placed into the load/lock mechanism 124 (FIG. 1) via the autoloader 122 to position the wafers on the wafer holder 120 within the vacuum chamber 118. The chamber 118 is evacuated to a selected pressure having an exemplary range from about $5\times10^{-7}$ Torr to about $2\times10^{-5}$ Torr. The fluid valve 134, i.e., the isolation valve 136 and the needle valve 138, is actuated to introduce a desired amount of fluid, e.g., water vapor, from the fluid surce 132 into the implantation chamber 118. The water vapor increases the pressure in the chamber to a level greater than that produced by the vacuum pump, e.g., from about $1\times10^{-7}$ to about $1\times10^{-4}$ Torr. In one embodiment, the water vapor introduced into the chamber produces a pressure of about $2\times10^{-5}$ Torr in the chamber. The system 100 initiates implantation of oxygen ions into the wafers 126 at a desired power level to create a buried silicon dioxide layer or BOX region in the wafers.

After completion of the implantation process, the wafers can be annealed using conventional techniques to clearly define the buried silicon dioxide layer (BOX region) and repair damage to the top silicon layer. In one embodiment, the wafers are heated to a temperature in the range from about 1300° Celsius to about 1350° Celsius for a duration of between about two and twelve hours. Exemplary ambient gases for the annealing process include argon and nitrogen. It is understood that one of ordinary skill in the art can readily vary the annealing parameters.

Figure 4:
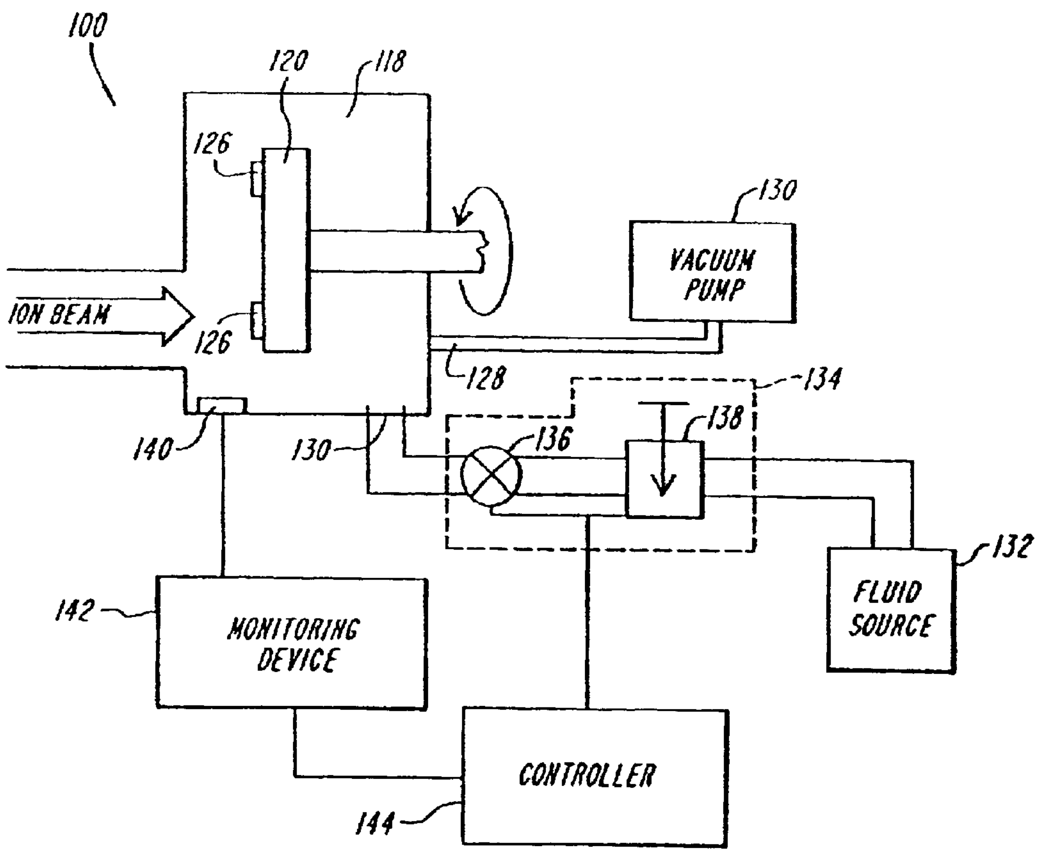
FIG. 4 is a diagrammatic representation of a further embodiment of an ion implantation system in accordance with the present invention employing active control of moisture levels within the chamber.

FIG. 4 shows an ion implantation system in accordance with the present invention including an active control system for controlling operating parameters, e.g., pressure, fluid concentration, and temperature, within the implantation chamber 118. That is, feedback in the form of conditions measured in the chamber are used to achieve certain operating parameters in the chamber, such as a predetermined water vapor concentration.

The system includes a transducer 140 disposed in the chamber 118 for measuring one or more conditions in the chamber. The transducer 140 is coupled to a monitoring device 142 for receiving a signal from the transducer 140. The monitoring device 142 is connected to a controller 144, which may form a part of a remote control panel. The controller 144 is coupled to the fluid valve 134 for controlling the amount of fluid that flows into the chamber 118.

It is understood that a variety of devices can be used for measuring the operating parameters to effect control of the chamber operating conditions, e.g., pressure, temperature, and vapor/ion concentrations, in the chamber 118. Exemplary monitoring devices include residual gas analyzers or mass spectrometers/analyzers, temperature sensors, and pressure monitors.

In one embodiment, the monitoring device 142 includes a residual gas analyzer (RGA) for determining the type and amount of gases in the chamber 118 as ions are implanted into the wafers. The RGA 142 provides this information to the controller 142 which maintains a desired level of water vapor (and dissociated ions) in the chamber by controlling the fluid valve 134.

Figure 5:
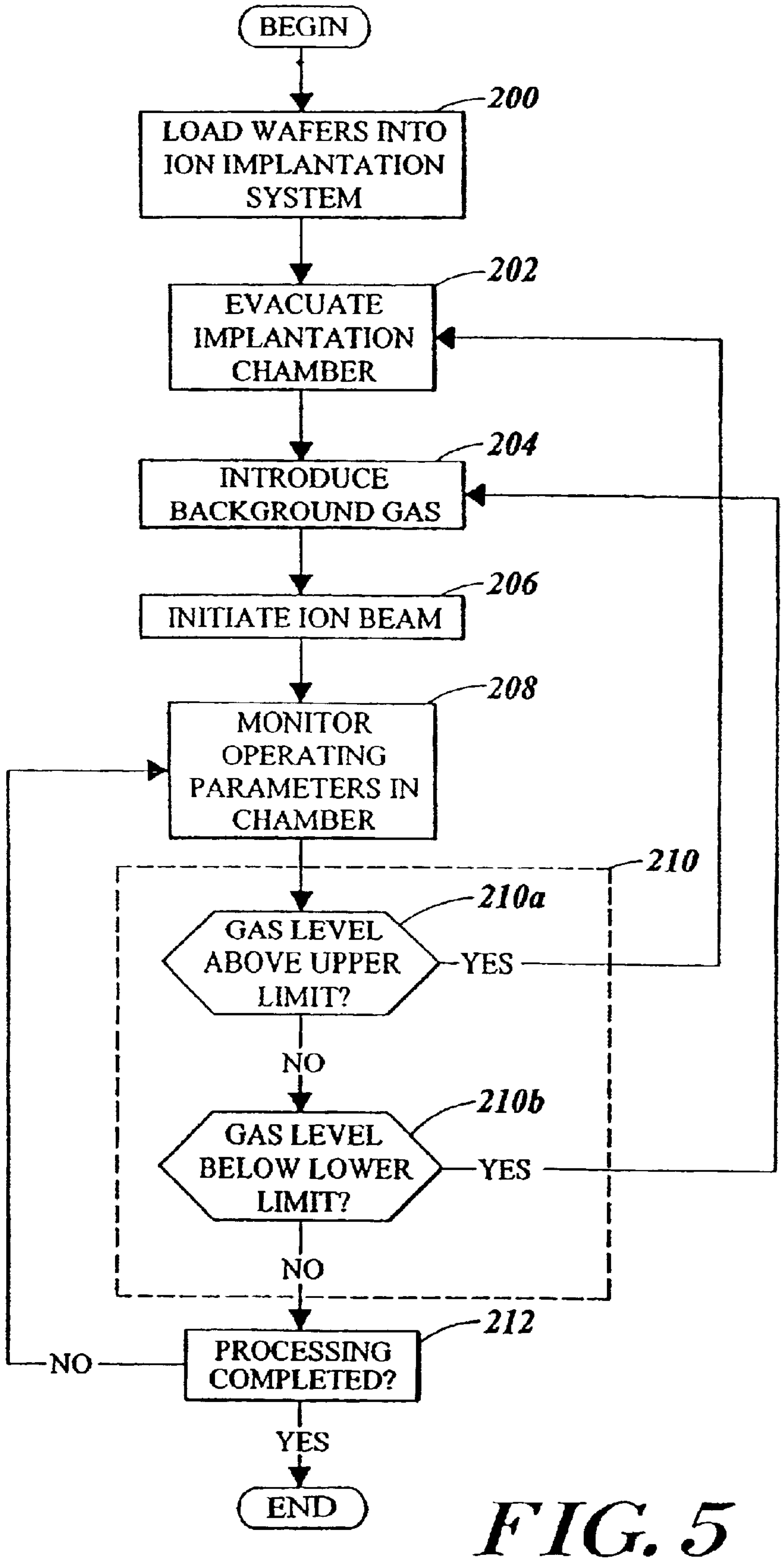
FIG. 5 is a flow diagram of an ion implantation process in accordance with the present invention.

FIG. 5, in combination with FIGS. 1–2, describe an exemplary technique for processing wafers in accordance with the present invention. In step 200, the wafers 126 are loaded into the autoloader 122 that facilitates positioning of the wafers onto the wafer holder 120 within the vacuum chamber 118. The vacuum pump 130 is actuated to evacuate the chamber 118 to desired pressure in step 202. It is understood that the vacuum load/lock mechanism 124 allows the vacuum chamber to be evacuated prior to placement of the wafers into the chamber 118. The fluid valve 134 is then activated to introduce water vapor into the vacuum chamber 118 until a desired pressure and/or concentration is achieved in step 204. In step 206, the ion source 103 is energized to initiate ion beam flow into the vacuum chamber 118 to bombard the wafers with oxygen ions as they rotate on the wafer holder 120.

In step 208, the operating conditions in the chamber 118 are monitored and actively controlled for optimal implantation of the ions. Exemplary conditions include pressure, gas/ion concentration, and temperature. In one embodiment, a residual gas analyzer is used to determine the concentrations of water vapor and hydrogen, for example, within the chamber 118. In step 210, the gas or vapor level is determined and compared to upper and lower limits of a desired range for vapor concentration in the chamber. If the upper limit is exceeded, as shown in step 210*a*, the chamber is evacuated to some extent in step 202. If the upper limit is not exceeded, it is determined whether the vapor concentration is below the lower limit in step 210*b*. If the vapor concentration is below the lower limit, additional background gas is introduced in step 204. Thus, based upon the vapor concentration levels in the chamber, the fluid valve 134 can be adjusted to achieve desired gas/ion levels. In step 212, it is determined whether processing is complete.

Figure 6:
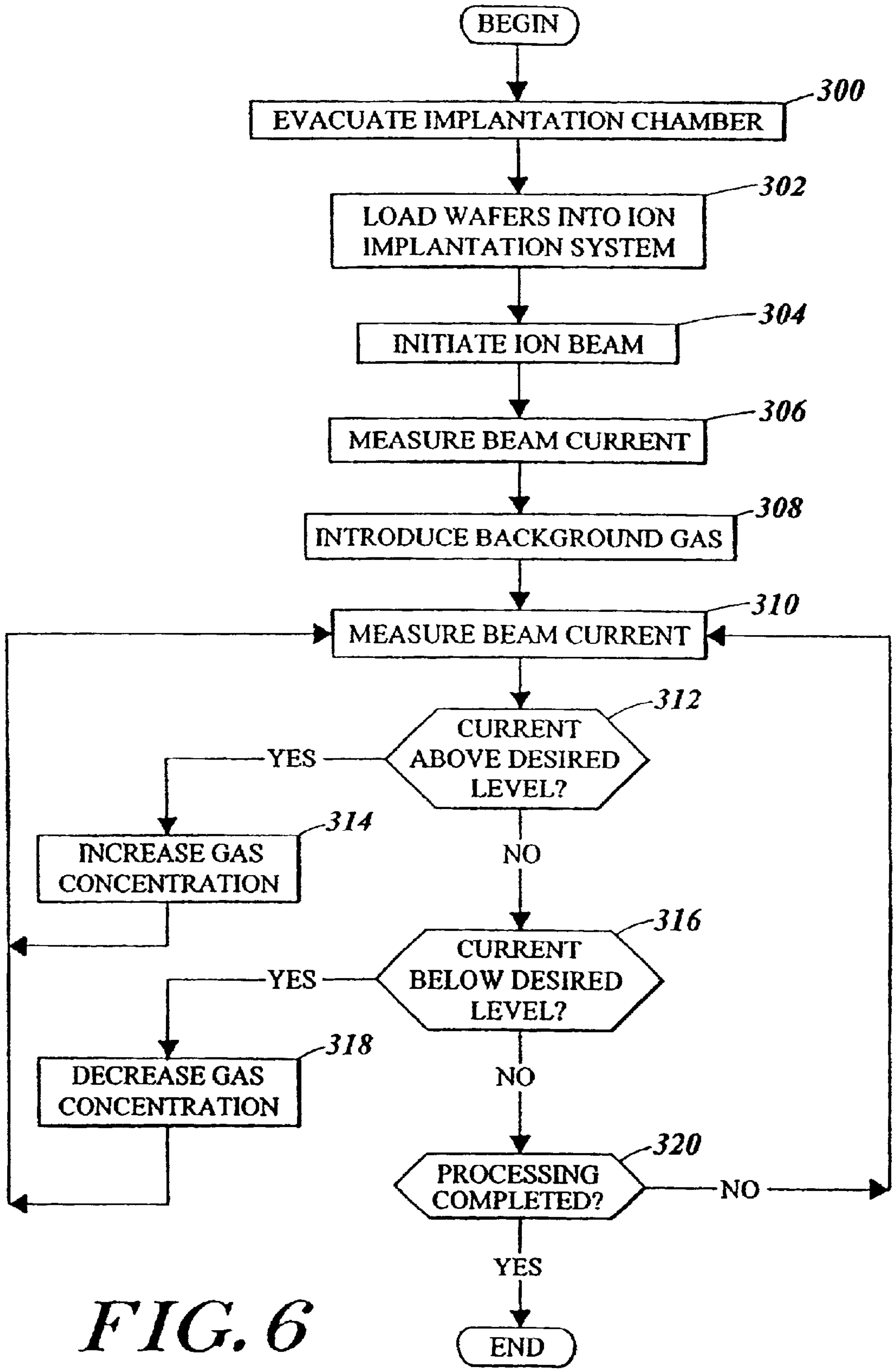
FIG. 6 is another flow diagram of an ion implantation process in accordance with the present invention showing moisture level adjustment corresponding to the beam current level.

FIG. 6 illustrates another exemplary technique for processing wafers in accordance with the present invention with the water vapor or steam concentration, for example, being adjusted based upon the ion beam current level. It is understood that some of the positively charged oxygen ions from the beam will become neutral, e.g., donate their charge to an activated ion, in the presence of the water vapor effectively decreasing the ion beam current level. In step 300, the implantation chamber is evacuated and in step 302, the wafers are loaded into the ion implantation system. The ion beam is activated in step 304, and in step 306 the initial ion beam current is measured prior to a background gas entering the chamber. In step 308, the background gas is introduced into the chamber and in step 310, the ion beam current is again measured. The measured ion beam current level is compared to a predetermined current level, which is less than the initial current level since the background gas will decrease the current level in the chamber. In an exemplary embodiment, the initial beam current is about 55 mA and the predetermined beam current level is about 52 mA. In step 312, it is determined whether the measured beam current level is at or near the predetermined current level. If the current level is too high, the gas concentration in the chamber is increased in step 314, and the beam current is again measured in step 310. If the measured current is not too high, it is determined whether the measured current is too low in step 316. If the current is too low, the gas concentration is decreased in step 318 and the beam current is again measured. In step 320, it is determined whether processing is complete. This technique provides non-invasive, robust control over the implantation operating parameters and the total ion dose.

It is understood that vapor concentration adjustment corresponding to ion beam current levels is not limited to forming buried oxide layers. This technique is applicable to implanting other types of ions, such as boron. In addition, the respective concentrations of multiple gases introduced into the implantation chamber can be adjusted based upon the ion beam current. It is further understood that ion beam measurement can occur in conjunction with temperature, pressure, and other operating parameters.

By introducing a background gas, such as water vapor, into the vacuum chamber during ion implantation in accordance with the present invention, the defect density of the processed wafers is significantly improved over conventional techniques. More particularly, defect densities of about $1\times10^{8}/cm^{2}$ are typical for SIMOX wafers processed with known methods. The present invention can produce wafers having a defect density below about $1\times10^{6}/cm^{2}$ thereby providing an improvement of about two orders of magnitude or more.

Without limiting the invention in any way, it is believed that the introduction of a fluid, such as water vapor, during the ion implantation process is effective to reduce threading dislocations by altering the surface chemistry of the wafers during the ion implantation process for increasing the amount of interstitial silicon that is brought to the wafer surface. Once on the surface, any formed oxide can be sputtered away leaving the monocrystalline silicon layer. During the implantation process, the water molecules dissociate into hydrogen and oxygen ions due to the relatively high temperature and ion beam energies. The resulting hydrogen ions may act as a reducing agent that decreases the amount of oxide formed on the wafer surface, which facilitates percolation of interstitial silicon up through the monocrystalline silicon layer. By reducing the amount of interstitial silicon in the top silicon layer, the number of threading dislocations or defects is concomitantly reduced.

It is understood that a variety of fluids can be introduced into the vacuum chamber during ion implantation at constant as well as varying rates. Exemplary fluids for introduction into the chamber as background gases include water, heavy water (deuterium oxide), air, argon, oxygen, hydrogen, and hydrogen-containing gases, such as ammonia. In one embodiment, hydrogen-containing gases are preferred. As used herein, the term "fluid" is to be construed broadly so as to cover liquids and gases.

It is further understood that the vacuum pressure/vapor concentration should be sufficiently low so as to allow adequate control of the ion beam. In an exemplary embodiment, prior to introduction of a background gas, the pressure in the vacuum chamber can range from about $2\times10^{-7}$ Torr to about $2\times10^{-5}$ Torr. Introduction of a background gas into the chamber raises the pressure to a level in the range from about $1\times10^{-6}$ Torr to about $1\times10^{-3}$ Torr.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method of processing a silicon substrate, comprising:

evacuating a vacuum chamber in which the substrate is placed to a first pressure, introducing a fluid other than molecular oxygen into the vacuum chamber as a background fluid, and subsequently, implanting ions into the substrate by applying an ion beam thereto, in the presence of the background fluid, to form a buried oxide layer under a top silicon layer, wherein the fluid inhibits formations of threading dislocations in the top silicon layer for reducing a defect density of the processed substrate.

2. The method according to claim 1, wherein the first pressure is less than about $1\times10^{5}$ Torr.

3. The method according to claim 1, wherein introducing the fluid into the vacuum chamber produces a second pressure in the vacuum chamber that is less than about $1\times10^{-3}$ Torr.

4. A method of processing a silicon substrate, comprising:

evacuating a vacuum chamber in which the substrate is placed to a first pressure, introducing a fluid other than molecular oxygen into the vacuum chamber as a background fluid, subsequently, implanting ions into the substrate, in the presence of the background fluid, to form a buried oxide layer under a top silicon layer, wherein the fluid inhibits formations of threading dislocations in the top silicon layer for reducing a defect density of the processed substrate, and actively controlling the amount of fluid introduced into the vacuum chamber based upon a parameter measured in the chamber.

5. The method according to claim 4, further including selecting the parameter from the group consisting of pressure, water vapor/ion concentration, and temperature.

6. A method of processing a silicon substrate, comprising evacuating a vacuum chamber in which the substrate is placed to a first pressure, introducing a fluid other than molecular oxygen into the vacuum chamber as a background fluid, actively controlling the amount of fluid introduced into the vacuum chamber based upon a parameter measured in the chamber, and implanting ions into the substrate to form a buried oxide layer under a top silicon layer, wherein the fluid inhibits formations of threading dislocations in the top silicon layer for reducing a defect density of the processed substrate, wherein the parameter includes a measurement of an ion beam current.

7. The method according to claim 6, wherein the measurement includes a measurement of a decrease in the beam current due to the fluid in the chamber.

8. A method of processing a substrate, comprising:

evacuating a vacuum chamber in which the substrate is placed to a first pressure;

introducing a fluid into the vacuum chamber;

implanting ions into the substrate using an ion beam to form a buried oxide layer under a top silicon layer;

measuring a decrease in the ion beam current level due to the fluid in the chamber; and adjusting the fluid level based upon the measured ion beam current level.

9. The method according to claim 8, further including the step of selecting the fluid from fluids that inhibit formations of threading dislocations in the top silicon layer for reducing a defect density of the processed substrate.

10. A method of processing a silicon substrate, comprising:

evacuating a vacuum chamber in which the substrate is placed to a first pressure, introducing a hydrogen containing fluid into the vacuum chamber as a background fluid, and subsequently, implanting ions into the substrate by applying an ion beam thereto, in the presence of the background fluid, to form a buried oxide layer under a top silicon layer, wherein the background fluid inhibits formations of threading dislocations in the top silicon layer for reducing a defect density of the processed substrate.

11. A method according to claim 10, further comprising selecting the fluid from the group consisting of water vapor, heavy water, air, and hydrogen gases.

12. A method of processing a silicon substrate, comprising:

evacuating a vacuum chamber in which the substrate is placed to a first pressure, introducing a fluid functioning as a reducing agent into the vacuum chamber as a background fluid, and subsequently, implanting ions into the substrate by applying an ion beam thereto, in the presence of the background fluid, to form a buried oxide layer under a top silicon layer, wherein the background fluid inhibits formations of threading dislocations in the top silicon layer for reducing a defect density of the processed substrate.

13. A method according to claim 12, further comprising selecting the fluid from the group consisting of hydrogen gases and argon.

14. A method of processing a silicon substrate, comprising:

evacuating a vacuum chamber in which the substrate is placed to a first pressure, introducing a fluid functioning as a surface oxide inhibiting agent into the vacuum chamber as a background fluid, and subsequently, implanting ions into the substrate by applying an ion beam thereto, in the presence of the background fluid, to form a buried oxide layer under a top silicon layer, wherein the background fluid inhibits formations of threading dislocations in the top silicon layer for reducing a defect density of the processed substrate.

15. The method of claim 14, further comprising selecting said fluid to be hydrogen gases.

* * * * *